United States Patent
Chopra et al.

(10) Patent No.: US 6,206,756 B1
(45) Date of Patent: Mar. 27, 2001

(54) TUNGSTEN CHEMICAL-MECHANICAL POLISHING PROCESS USING A FIXED ABRASIVE POLISHING PAD AND A TUNGSTEN LAYER CHEMICAL-MECHANICAL POLISHING SOLUTION SPECIFICALLY ADAPTED FOR CHEMICAL-MECHANICAL POLISHING WITH A FIXED ABRASIVE PAD

(75) Inventors: Dinesh Chopra; Scott G. Meikle, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/189,703

(22) Filed: Nov. 10, 1998

(51) Int. Cl.$^7$ ............................................. B24B 1/00
(52) U.S. Cl. ............................ 451/28; 451/36; 451/41; 51/308
(58) Field of Search ............................... 451/28, 36, 41, 451/53, 56; 51/308, 293

(56) References Cited

U.S. PATENT DOCUMENTS

| | | | |
|---|---|---|---|
| 4,295,923 | 10/1981 | Kasper | 156/630 |
| 4,311,551 | 1/1982 | Sykes | 156/640 |
| 4,879,258 | 11/1989 | Fisher | 437/225 |
| 4,944,836 | 7/1990 | Beyer et al. | 156/645 |
| 4,956,313 | 9/1990 | Cote et al. | 437/203 |
| 4,992,135 | 2/1991 | Doan | 156/636 |
| 5,020,283 | 6/1991 | Tuttle | 51/209 |
| 5,209,816 | 5/1993 | Yu et al. | 156/636 |
| 5,232,875 | 8/1993 | Tuttle et al. | 437/225 |
| 5,262,354 | 11/1993 | Cote et al. | 437/195 |

(List continued on next page.)

FOREIGN PATENT DOCUMENTS

| | | |
|---|---|---|
| 0 747 939 A2 | 12/1996 | (EP) . |
| 0 708 160 A3 | 6/1997 | (EP) . |
| 0 811 666 A2 | 12/1997 | (EP) . |
| 0 846 742 A2 | 6/1998 | (EP) . |
| 0 747 939 A3 | 10/1998 | (EP) . |
| 0 811 666 A3 | 10/1998 | (EP) . |
| 0 846 742 A3 | 10/1998 | (EP) . |
| 0 896 042 A1 | 2/1999 | (EP) . |
| 0 913 442 A2 | 5/1999 | (EP) . |
| WO 96/16436 | 5/1996 | (WO) . |
| WO 98/49723 | 11/1998 | (WO) . |

OTHER PUBLICATIONS

U.S. application No. 09/189,896, filed Nov. 10, 1998, Chopra.

*Primary Examiner*—M. Rachuba
(74) *Attorney, Agent, or Firm*—Wells, St. John, Roberts, Gregory & Matkin P.S.

(57) ABSTRACT

The invention comprises tungsten chemical-mechanical polishing processes using fixed abrasive polishing pads, and to tungsten layer chemical-mechanical polishing solutions specifically adapted for chemical-mechanical polishing with fixed abrasive pads. In one implementation, a semiconductor wafer having a layer comprising tungsten at greater than or equal to 50% molar is provided. Such is positioned in proximity with a fixed abrasive chemical-mechanical polishing pad. A tungsten layer chemical-mechanical polishing solution is provided intermediate the wafer and pad. The solution comprises a tungsten oxidizing component present at from about 0.5% to 15% by volume and a pH of less than or equal to about 6.0. The tungsten comprising layer is chemical-mechanical polished with the fixed abrasive pad with the tungsten layer chemical-mechanical polishing solution being received between the wafer and the pad. In one implementation, tungsten from the layer is oxidized with a solution comprising a tungsten oxidizing component present at from about 0.5% to 15% by volume and a pH of less than or equal to about 6.0. One or both of tungsten and tungsten oxide is then polished from the tungsten comprising layer with a fixed abrasive chemical-mechanical polishing pad. In one implementation, the invention comprises a tungsten layer chemical-mechanical polishing solution.

48 Claims, 1 Drawing Sheet

U.S. PATENT DOCUMENTS

| | | | |
|---|---|---|---|
| 5,297,364 | 3/1994 | Tuttle | 51/209 |
| 5,340,370 | 8/1994 | Cadien et al. | 51/308 |
| 5,391,258 | 2/1995 | Brancaleoni et al. | 156/636 |
| 5,453,312 | 9/1995 | Haas et al. | 428/143 |
| 5,516,346 | 5/1996 | Cadien et al. . | |
| 5,575,885 | 11/1996 | Hirabayashi et al. | 156/626.1 |
| 5,578,362 | 11/1996 | Reinhardt et al. | 428/147 |
| 5,578,523 | 11/1996 | Fiordalice et al. | 437/190 |
| 5,622,525 | 4/1997 | Haisma et al. . | |
| 5,624,303 | 4/1997 | Robinson | 451/285 |
| 5,700,348 | 12/1997 | Sakurai | 156/636.1 |
| 5,700,389 | 12/1997 | Nakagawa | 252/79.2 |
| 5,725,417 | 3/1998 | Robinson | 451/56 |
| 5,733,176 | 3/1998 | Robinson et al. | 451/41 |
| 5,782,675 | 7/1998 | Southwick | 451/56 |
| 5,783,489 | 7/1998 | Kaufman et al. . | |
| 5,836,806 | 11/1998 | Cadien et al. . | |
| 5,840,629 | 11/1998 | Carpio . | |
| 5,897,375 | 4/1999 | Watts et al. . | |
| 5,954,975 | 9/1999 | Cadien et al. . | |
| 5,954,997 | 9/1999 | Kaufman et al. . | |
| 5,958,794 | * 9/1999 | Bruxvoort et al. | 451/539 |
| 5,972,792 | * 10/1999 | Hudson | 438/691 |
| 5,981,454 | 11/1999 | Small . | |
| 5,993,686 | 11/1999 | Streinz et al. . | |

* cited by examiner

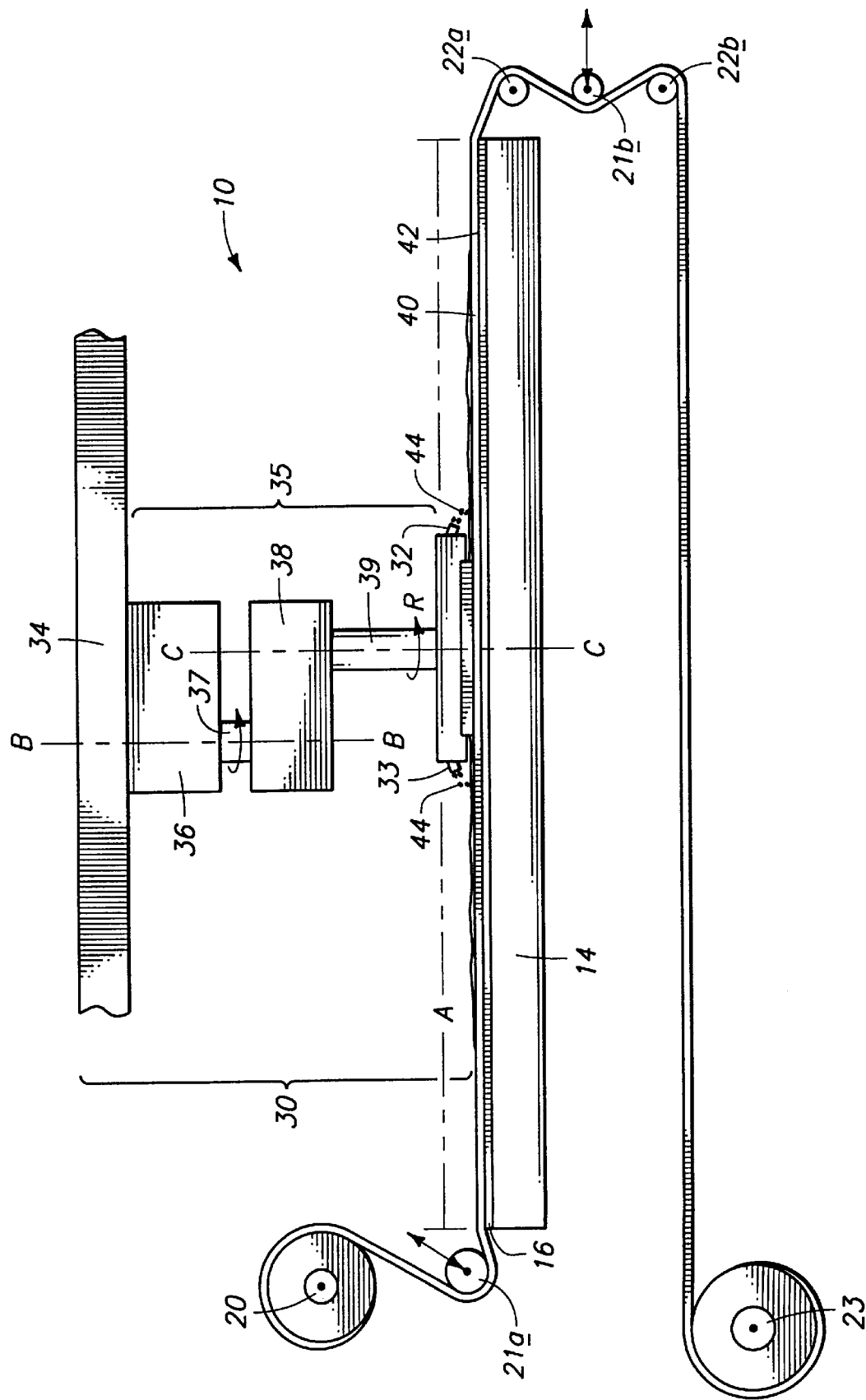

TUNGSTEN CHEMICAL-MECHANICAL POLISHING PROCESS USING A FIXED ABRASIVE POLISHING PAD AND A TUNGSTEN LAYER CHEMICAL-MECHANICAL POLISHING SOLUTION SPECIFICALLY ADAPTED FOR CHEMICAL-MECHANICAL POLISHING WITH A FIXED ABRASIVE PAD

TECHNICAL FIELD

This invention relates to tungsten chemical-mechanical polishing processes using fixed abrasive polishing pads, and to tungsten layer chemical-mechanical polishing solutions specifically adapted for chemical-mechanical polishing with fixed abrasive pads.

BACKGROUND OF THE INVENTION

In the manufacture of integrated circuits from semiconductor wafers and substrates, wafer polishing is a common technique utilized to remove material and/or achieve planarity. Such polishing can be conducted by purely chemical, purely mechanical or chemical-mechanical polishing means (CMP). With CMP, polishing and removal occurs by a combination of both chemical and mechanical polishing action. CMP utilizes a combination of solid abrasives and chemicals to achieve the combination polishing action. One type of chemical-mechanical polishing utilizes a slurry comprising very hard, solid abrasive particles suspended in a chemical solution. The slurry is interposed between a pad and a wafer, with both typically being caused to rotate, and material removed from the wafer by both chemical and mechanical action. Another form of CMP provides abrasive material embedded within the surface of the polishing pad, and is commonly referred to as fixed abrasive CMP.

Unfortunately, conventional CMP slurries designed for non-fixed abrasive CMP create problems and do not always work satisfactorily in fixed abrasive CMP processes. This has been discovered to be particularly true in the CMP of layers where tungsten is present at greater than or equal to fifty atomic percent. Tungsten finds existing use as a contact/plugging material in fabrication of DRAM and other circuitry. While CMP of tungsten has been reported using non-fixed abrasive pads and slurries, existing materials have proven less than satisfactory when using fixed abrasive pads. Accordingly, needs remain for improved chemical-mechanical processes using fixed abrasive pads and in the development of polishing solutions therefor.

SUMMARY OF THE INVENTION

The invention comprises tungsten chemical-mechanical polishing processes using fixed abrasive polishing pads, and to tungsten layer chemical-mechanical polishing solutions specifically adapted for chemical-mechanical polishing with fixed abrasive pads. In the context of this document unless otherwise specifically literally narrowed, a "tungsten layer" constitutes a layer having tungsten present at least at 50% molar. In one implementation, a semiconductor wafer having a layer comprising tungsten at greater than or equal to 50% molar is provided. Such is positioned in proximity with a fixed abrasive chemical-mechanical polishing pad. A tungsten layer chemical-mechanical polishing solution is provided intermediate the wafer and pad. The solution comprises a tungsten oxidizing component present at from about 0.5% to 15% by volume and a pH of less than or equal to about 6.0. The tungsten comprising layer is chemical-mechanical polished with the fixed abrasive pad with the tungsten layer chemical-mechanical polishing solution being received between the wafer and the pad. Believed process mechanisms by which polishings occur in accordance with the invention are disclosed, but are not intended to be limiting unless expressly worded in the respective claim. In one implementation, the invention comprises a tungsten layer chemical-mechanical polishing solution.

BRIEF DESCRIPTION OF THE DRAWINGS

FIG. 1 is a diagrammatic view of a prior art chemical-mechanical polishing apparatus used in accordance with an aspect of the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a semiconductor wafer having an outer layer or region comprising tungsten at greater than or equal to 50% molar is polished with improved solutions using fixed abrasive pads. The invention was principally predicated upon the chemical-mechanical polishing of tungsten layers consisting essentially of elemental tungsten. However, the invention is anticipated to have applicability to polishing any tungsten layers having greater than or equal to 50% molar tungsten content, including such layers consisting essentially of tungsten alloys.

A wafer having such a layer is positioned within a suitable chemical-mechanical polishing apparatus comprising a fixed abrasive chemical-mechanical polishing pad. Any suitable apparatus is usable, such as by way of example only, those apparatus which rotate/revolve both a fixed abrasive pad and the wafer, those apparatus which rotate/move a fixed abrasive pad and not the wafer, those apparatus which rotate/revolve the wafer and not a fixed abrasive pad, etc. Fixed abrasive pads can be purchased from many suppliers, such as the 3M Company of St. Paul, Minn. A tungsten layer chemical-mechanical polishing solution in accordance with the invention is provided intermediate the pad and the wafer utilizing the polishing equipment. In one implementation, the solution comprises a tungsten oxidizing component present at from about 0.5% to 15% by volume and a pH of less than or equal to about 6.0.

Example preferred oxidizing components include nitrate and other compounds. Specific examples include potassium permanganate, ferric nitrate, hydrogen peroxide, nitric acid, ammonium persulfate, potassium iodate, potassium nitrate, ammonium molybdate and mixtures thereof. Solution pH is more preferably kept at less than 4.0, such as from 3.0 to 4.0. The solution also preferably comprises a pH buffer, with potassium hydrogen phthalate, ammonium citrate, ammonium phosphate and mixtures thereof being examples. A preferred concentration range for the buffer is from about 0.1% to 10% by weight. The solution is most ideally provided to be void of solid abrasive material, at least prior to starting chemical-mechanical polishing. Once polishing commences with the fixed abrasive pad, it is possible that some abrasive material from the pad will break off of the pad and find its way into solution, but ideally the solution is essentially abrasive-free in accordance with the most preferred aspects of the invention. The solution can also comprise a surfactant, for example present at a concentration of from 1% to 10% by volume. Example surfactants include polyethylene glycol, polyoxyethylene ether, glycerol, polypropylene glycol, polyoxyethylene lauryl ether, polyoxyethylene cetyl ether, polyoxyethylene stearyl ether, polyoxyethylene oleyl ether, and mixtures thereof. The solution might further comprise thickeners to achieve desired viscosity, with an example preferred range being from about 10 centipoise to 20 centipoise at room temperature. Examples of thickeners include Polyox™ available from Union Carbide of Danbury, Conn. and Carbopol™ available from B.F. Goodrich of Cleveland, Ohio.

The solution also preferably comprises a complexing agent in solution for complexing tungsten or an oxidation product thereof. Preferred complexants are amine compounds. Specific examples are triethanolamine, trietheylenediamine, ammonium citrate, ammonium phosphate, ammonium oxalate, ammonium carbonate and mixtures thereof. A preferred concentration range for the complexing agent is from about 0.1% to about 10% by weight.

The solution also preferably comprises a tungsten corrosion inhibitor (i.e., preferably at a concentration of from 0.01% to 2% by weight) to protect tungsten in the low lying areas and to improve planarity and dishing performance of the polish. Examples include phosphates, polyphosphates and silicates, with potassium hypophosphite and potassium silicate being but two specific examples.

With such exemplary solutions in accordance with the invention received intermediate the wafer and pad, the tungsten comprising layer is chemical-mechanical polished with the fixed abrasive pad.

In another considered aspect of the invention, tungsten from the layer being polished is oxidized with a solution comprising a tungsten oxidizing component present at from about 0.5% to 15% by volume and a pH of less than or equal to about 6.0. One or both of tungsten and tungsten oxide from the tungsten comprising layer is polished with a fixed abrasive chemical-mechanical polishing pad. The oxidized tungsten might oxidize on the layer prior to removal, or be polished away from the layer as tungsten and be oxidized and dissolved in solution thereafter. Both of these actions might also occur, with one or the other possibly predominating. Solution components during polishing preferably constitute those as described above, and again in significant consideration is ideally void of solid abrasive material.

Polishing of tungsten is preferably conducted with soft abrasives, such as $SiO_2$, to reduce or avoid scratch or chatter marks from occurring on the polished tungsten surface. Further, pH is preferably kept below 4 to facilitate the polish. Yet in prior art chemical-mechanical polishing solutions and processes, it has been found that $SiO_2$ abrasives do not remain well dispersed throughout the solution when pH falls below 4.0. This has typically resulted in using additional or other harder abrasive materials than desired to achieve a suitable solution during polish. Fixed abrasive polishing using solutions of the invention can enable utilization of $SiO_2$ as the abrasive on the pad in combination with pH's at or below 4.0.

Further in many instances, it would be desirable to maintain temperature at or below room temperature during the tungsten polish (i.e., at or below 74° F.). This is seldom practical where lower slurry temperature will also result in poor abrasive material dispersal throughout the slurry during polish. Accordingly, elevated temperatures are utilized during the polish. Yet in accordance with an aspect of the invention, slurry temperature during polish can be maintained at or below room temperature (further preferably at or below 65° F.) where the abrasive is fixed on the pad and agglomeration of abrasives within the slurry is not a concern. Polishing in all embodiments preferably is conducted at atmospheric pressure and anywhere from 40° F. up to 145° F., although other conditions are of course possible.

Example equipment and processing utilized in accordance with the invention is described with reference to FIG. 1, wherein a web-format planarizing machine 10 is used for chemical-mechanical polishing a semiconductor wafer 12. Planarizing machine 10 has a support table 14 with a top panel 16 at a work station where an operative portion (A) of a planarizing pad 40 is positioned. The top-half panel 16 is generally a rigid plate to provide a flat, solid surface to which a particular section of planarizing pad 40 may be secured during polishing.

Planarizing machine 10 also has a plurality of rollers to guide, position and hold planarizing pad 40 over top panel 16. The rollers include a supply roller 20, first and second idler rollers 21a and 21b, first and second guide rollers 22a and 22b, and a take-up roller 23. The supply roller 20 carries an unused or pre-operative portion of the planarizing pad 40, and take-up roller carries a used or post-operative portion of planarizing pad 40. First idler roller 21a and first guide roller 22a stretch planarizing pad 40 over top panel 16 to hold the planarizing pad 40 stationary during operation. Planarizing pad 40 in accordance with the invention preferably comprises a fixed abrasive pad, such as described above, and having a length greater than a maximum diameter of the wafers being polished. A motor (not shown) drives at least one of supply roller 20 and take-up roller 23 to sequentially advance the planarizing pad 40 across the top-panel 16. As such, clean pre-operative sections of the planarizing pad 40 may be quickly substituted for used sections to provide a consistent surface for planarizing and/or cleaning the substrate.

The web-format planarizing machine 10 has a carrier assembly 30 that controls and protects wafer 12 during polishing. Carrier assembly 30 generally has a substrate holder 32 to pick up, hold and release wafer 12 at appropriate stages of the polishing cycle. A plurality of nozzles 33 attached to substrate holder 32 dispense a planarizing solution 44 in accordance with the invention onto a planarizing surface 42 of planarizing pad 40. Carrier assembly 30 also generally has a support gantry 34 carrying a drive assembly 35 that translates along gantry 34. Drive assembly 35 generally has an actuator 36, a drive shaft 37 coupled to the actuator 36, and an arm 38 projecting from drive shaft 37. Arm 38 carries substrate holder 32 via another shaft 39 such that drive assembly 35 orbits substrate holder 32 about an axis B—B offset from a center point C—C of wafer 12.

In accordance with an aspect of the invention, the process preferably comprises moving web/pad 40 a distance less than the maximum diameter of the wafer such that a subsequently polished wafer is exposed to a fresh pad segment which was not utilized to polish the immediately preceding wafer. Preferably, the distance moved is less than or equal to 1.0% of the maximum diameter for uniformity of polish and to extend life of the pad. For example for an 8-inch diameter wafer, an incremental movement of pad/web 40 between each polishing is 0.25 inch.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A chemical-mechanical polishing process comprising:
providing a semiconductor wafer having a layer comprising tungsten at greater than or equal to 50% molar;
positioning the wafer in proximity with a fixed abrasive chemical-mechanical polishing pad;
providing a tungsten layer chemical-mechanical polishing solution intermediate the wafer and pad, the tungsten laver chemical-mechanical polishing solution comprising a tungsten oxidizing component present at from about 0.5% to 15% by volume and a pH of less than or equal to about 6.0;
chemical-mechanical polishing the tungsten comprising layer with the fixed abrasive pad with the tungsten layer chemical-mechanical polishing solution being received between the wafer and the pad; and
complexing tungsten or an oxidation product thereof with a complexing agent in the solution comprising from 0.1% to 10% by weight of the solution.

2. The chemical-mechanical polishing process of claim 1 wherein the complexing agent is selected from the group consisting of triethanolamine, trietheylenediamine, ammonium citrate, ammonium phosphate, ammonium oxalate, ammonium carbonate and mixtures thereof.

3. The chemical-mechanical polishing process of claim 1 wherein the complexing agent comprises triethanolamine.

4. The chemical-mechanical polishing process of claim 1 wherein the complexing agent comprises trietheylenediamine.

5. The chemical-mechanical polishing process of claim 1 wherein the complexing agent comprises ammonium citrate.

6. The chemical-mechanical polishing process of claim 1 wherein the complexing agent comprises ammonium phosphate.

7. The chemical-mechanical polishing process of claim 1 wherein the complexing agent comprises ammonium oxalate.

8. The chemical-mechanical polishing process of claim 1 wherein the complexing agent comprises ammonium carbonate.

9. A chemical-mechanical polishing process comprising:
providing a semiconductor wafer having a layer comprising tungsten at greater than or equal to 50% molar;
positioning the wafer in proximity with a fixed abrasive chemical-mechanical polishing pad;
providing a tungsten layer chemical-mechanical polishing solution intermediate the wafer and pad, the tungsten layer chemical-mechanical polishing solution comprising a tungsten oxidizing component present at from about 0.5% to 15% by volume and a pH of less than or equal to about 6.0;
chemical-mechanical polishing the tungsten comprising layer with the fixed abrasive pad with the tungsten layer chemical-mechanical polishing solution being received between the wafer and the pad; and
wherein the solution comprises a surfactant selected from group consisting of polyethylene glycol, polyoxyethylene ether, glycerol, polypropylene glycol, polyoxyethylene lauryl ether, polyoxyethylene cetyl ether, polyoxyethylene stearyl ether, polyoxyethylene oleyl ether, and mixtures thereof.

10. The chemical-mechanical polishing process of claim 9 wherein the surfactant comprises polyethylene glycol.

11. The chemical-mechanical polishing process of claim 9 wherein the surfactant comprises polyoxyethylene ether.

12. The chemical-mechanical polishing process of claim 9 wherein the surfactant comprises glycerol.

13. The chemical-mechanical polishing process of claim 9 wherein the surfactant comprises polypropylene glycol.

14. The chemical-mechanical polishing process of claim 9 wherein the surfactant comprises polyoxyethylene lauryl ether.

15. The chemical-mechanical polishing process of claim 9 wherein the surfactant comprises polyoxyethylene cetyl ether.

16. The chemical-mechanical polishing process of claim 9 wherein the surfactant comprises polyoxyethylene stearyl ether.

17. The chemical-mechanical polishing process of claim 9 wherein the surfactant comprises polyoxyethylene oleyl ether.

18. A chemical-mechanical polishing process comprising:
providing a semiconductor wafer having a layer comprising tungsten at greater than or equal to 50% molar;
positioning the wafer in proximity with a fixed abrasive chemical-mechanical polishing pad;
providing a tungsten layer chemical-mechanical polishing solution intermediate the wafer and pad, the tungsten layer chemical-mechanical polishing solution comprising a tungsten oxidizing component present at from about 0.5% to 15% by volume and a pH of less than or equal to about 6.0;
chemical-mechanical polishing the tungsten comprising layer with the fixed abrasive pad with the tungsten layer chemical-mechanical polishing solution being received between the wafer and the pad; and
wherein the solution comprises a thickener and has a viscosity of from about 10 centipoise to 20 centipoise at room temperature.

19. A chemical-mechanical polishing process comprising:
providing a semiconductor wafer having a layer comprising tungsten at greater than or equal to 50% molar;
positioning the wafer in proximity with a fixed abrasive chemical-mechanical polishing pad;
providing a tungsten layer chemical-mechanical polishing solution intermediate the wafer and pad, the tungsten layer chemical-mechanical polishing solution comprising a tungsten oxidizing component present at from about 0.5% to 15% by volume and a pH of less than or equal to about 6.0;
chemical-mechanical polishing the tungsten comprising layer with the fixed abrasive pad with the tungsten layer chemical-mechanical polishing solution being received between the wafer and the pad; and
wherein the solution comprises a tungsten corrosion inhibitor selected from the group consisting of phosphates, polyphosphates, silicates and mixtures thereof.

20. The chemical-mechanical polishing process of claim 19 wherein the tungsten corrosion inhibitor comprises a phosphate.

21. The chemical-mechanical polishing process of claim 19 wherein the tungsten corrosion inhibitor comprises a polyphosphate.

22. The chemical-mechanical polishing process of claim 19 wherein the tungsten corrosion inhibitor comprises a silicate.

23. A chemical-mechanical polishing process comprising:
providing a semiconductor wafer having a layer comprising tungsten at greater than or equal to 50% molar;
positioning the wafer in proximity with a fixed abrasive chemical-mechanical polishing pad;
providing a tungsten layer chemical-mechanical polishing solution intermediate the wafer and pad, the tungsten layer chemical-mechanical polishing solution comprising a tungsten oxidizing component present at from about 0.5% to 15% by volume and a pH of less than or equal to about 6.0;
chemical-mechanical polishing the tungsten comprising layer with the fixed abrasive pad with the tungsten layer chemical-mechanical polishing solution being received between the wafer and the pad; and
wherein the solution comprises a pH buffer comprising from 0.1% to 10% by weight of the solution.

24. A chemical-mechanical polishing process comprising:
providing a semiconductor wafer having a layer comprising tungsten at greater than or equal to 50% molar;
positioning the wafer in proximity with a fixed abrasive chemical-mechanical polishing pad;
providing a tungsten layer chemical-mechanical polishing solution intermediate the wafer and pad, the tungsten layer chemical-mechanical polishing solution comprising a tungsten oxidizing component present at from about 0.5% to 15% by volume and a pH of less than or equal to about 6.0;
chemical-mechanical polishing the tungsten comprising layer with the fixed abrasive pad with the tungsten layer chemical-mechanical polishing solution being received between the wafer and the pad; and
wherein the solution comprises a pH buffer selected from the group consisting of potassium hydrogen phthalate, ammonium citrate, ammonium phosphate and mixtues thereof.

25. The chemical-mechanical polishing process of claim 24 wherein the pH buffer comprises potassium hydrogen phthalate.

26. The chemical-mechanical polishing process of claim 24 wherein the pH buffer comprises ammonium citrate.

27. The chemical-mechanical polishing process of claim 24 wherein the pH buffer comprises ammonium phosphate.

28. A chemical-mechanical polishing process comprising:
providing a semiconductor wafer having a layer comprising tungsten at greater than or equal to 50% molar;
positioning the wafer in proximity with a fixed abrasive chemical-mechanical polishing pad;
providing a tungsten layer chemical-mechanical polishing solution intermediate the wafer and pad, the tungsten layer chemical-mechanical polishing solution comprising a tungsten oxidizing component present at from about 0.5% to 15% by volume and a pH of less than or equal to about 6.0;
chemical-mechanical polishing the tungsten comprising layer with the fixed abrasive pad with the tungsten layer chemical-mechanical polishing solution being received between the wafer and the pad; and
comprising maintaining temperature of the solution during polishing at or below about 74° F.

29. A chemical-mechanical polishing process comprising:
providing a semiconductor wafer having a layer comprising tungsten at greater than or equal to 50% molar;
positioning the wafer in proximity with a fixed abrasive chemical-mechanical polishing pad;
providing a tungsten layer chemical-mechanical polishing solution intermediate the wafer and pad, the tungsten layer chemical-mechanical polishing solution comprising a tungsten oxidizing component present at from about 0.5% to 15% by volume and a pH of less than or equal to about 6.0;
chemical-mechanical polishing the tungsten comprising layer with the fixed abrasive pad with the tungsten layer chemical-mechanical polishing solution being received between the wafer and the pad; and
comprising maintaining temperature of the solution during polishing at or below about 65° F.

30. A tungsten layer chemical-mechanical polishing solution specifically adapted for chemical-mechanical polishing with a fixed abrasive pad, the solution comprising a tungsten oxidizing component present at from about 0.5% to 15% by volume, a pH of less than or equal to about 6.0, and a surfactant selected from group consisting of polyethylene glycol, polyoxyethylene ether, glycerol, polypropylene glycol, polyoxyethylene lauryl ether, polyoxyethylene cetyl ether, polyoxyethylene stearyl ether, polyoxyethylene oleyl ether, and mixtures thereof.

31. The chemical-mechanical polishing solution of claim 30 wherein the surfactant comprises polyethylene glycol.

32. The chemical-mechanical polishing solution of claim 30 wherein the surfactant comprises polyoxyethylene ether.

33. The chemical-mechanical polishing solution of claim 30 wherein the surfactant comprises glycerol.

34. The chemical-mechanical polishing solution of claim 30 wherein the surfactant comprises polypropylene glycol.

35. The chemical-mechanical polishing solution of claim 30 wherein the surfactant comprises polyoxyethylene lauryl ether.

36. The chemical-mechanical polishing solution of claim 30 wherein the surfactant comprises polyoxyethylene cetyl ether.

37. The chemical-mechanical polishing solution of claim 30 wherein the surfactant comprises polyoxyethylene stearyl ether.

38. The chemical-mechanical polishing solution of claim 30 wherein the surfactant comprises polyoxyethylene oleyl ether.

39. A tungsten layer chemical-mechanical polishing solution specifically adapted for chemical-mechanical polishing with a fixed abrasive pad, the solution comprising a tungsten oxidizing component present at from about 0.5% to 15% by volume, a pH of less than or equal to about 6.0, and a thickener and has a viscosity of from about 10 centipoise to 20 centipoise at room temperature.

40. A tungsten layer chemical-mechanical polishing solution specifically adapted for chemical-mechanical polishing with a fixed abrasive pad, the solution comprising a tungsten oxidizing component present at from about 0.5% to 15% by volume, a pH of less than or equal to about 6.0, and a tungsten corrosion inhibitor selected from the group consisting of phosphates, polyphosphates, silicates and mixtures thereof.

41. The chemical-mechanical polishing solution of claim 40 wherein the tungsten corrosion inhibitor comprises a phosphate.

42. The chemical-mechanical polishing solution of claim 40 wherein tungsten corrosion inhibitor comprises a polyphosphate.

43. The chemical-mechanical polishing solution of claim 40 wherein the tungsten corrosion inhibitor comprises a silicate.

44. A tungsten layer chemical-mechanical polishing solution specifically adapted for chemical-mechanical polishing with a fixed abrasive pad, the solution comprising a tungsten oxidizing component present at from about 0.5% to 15% by volume, a pH of less than or equal to about 6.0, and a pH buffer comprising from 0.1% to 10% by weight of the solution.

45. A tungsten layer chemical-mechanical polishing solution specifically adapted for chemical-mechanical polishing with a fixed abrasive pad, the solution comprising a tungsten oxidizing component present at from about 0.5% to 15% by volume, a pH of less than or equal to about 6.0, and a pH buffer selected from the group consisting of potassium hydrogen phthalate, ammonium citrate, ammonium phosphate and mixtures thereof.

46. The chemical-mechanical polishing solution of claim 45 wherein the pH buffer comprises potassium hydrogen phthalate.

47. The chemical-mechanical polishing solution of claim 45 wherein the pH buffer comprises ammonium citrate.

48. The chemical-mechanical polishing solution of claim 45 wherein the pH buffer comprises ammonium phosphate.

* * * * *